United States Patent
Senda et al.

(10) Patent No.: US 6,830,949 B2
(45) Date of Patent: Dec. 14, 2004

(54) METHOD FOR PRODUCING GROUP-III NITRIDE COMPOUND SEMICONDUCTOR DEVICE

(75) Inventors: Masanobu Senda, Aichi (JP); Jun Ito, Aichi (JP); Toshiaki Chiyo, Aichi (JP); Naoki Shibata, Aichi (JP); Shizuyo Asami, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 100 days.

(21) Appl. No.: 10/258,128

(22) PCT Filed: Apr. 20, 2001

(86) PCT No.: PCT/JP01/03387

§ 371 (c)(1),
(2), (4) Date: Oct. 21, 2002

(87) PCT Pub. No.: WO01/82347

PCT Pub. Date: Nov. 1, 2001

(65) Prior Publication Data

US 2003/0109076 A1 Jun. 12, 2003

(30) Foreign Application Priority Data

Apr. 21, 2000 (JP) .................... 2000-121692

(51) Int. Cl.$^7$ ............................................. H01L 21/00
(52) U.S. Cl. ................ 438/46; 438/93; 438/22
(58) Field of Search ..................... 438/46, 22, 34, 438/93

(56) References Cited

FOREIGN PATENT DOCUMENTS

| JP | 57-010280 | 1/1982 |
| JP | 58-171568 | 10/1983 |
| JP | 59-52526 | 3/1984 |
| JP | 60-173829 | 9/1985 |
| JP | 1-52910 | 11/1989 |
| JP | 5-86646 | 12/1993 |
| JP | 8-310900 | 11/1996 |
| JP | 9-227297 | 9/1997 |

Primary Examiner—Van Thu Nguyen
Assistant Examiner—Beth E. Owens
(74) Attorney, Agent, or Firm—McGinn & Gibb, PLLC

(57) ABSTRACT

A preferred condition for forming a Group III nitride compound semiconductor layer on a substrate by a sputtering method is proposed. When a first Group III nitride compound semiconductor layer is formed on a substrate by a sputtering method, an initial voltage of a sputtering apparatus is selected to be not higher than 110% of a sputtering voltage.

16 Claims, 12 Drawing Sheets

FIG.1

RELATION BETWEEN INITIAL VOLTAGE RATIO AND LUMINOUS INTENSITY

RELATION BETWEEN RESIDUAL GAS PRESSURE AND APPLIED VOLTAGE

FIG.4

OUT GASSING CHARACTERISTIC OF TRAY

TABLE 1 RELATION BETWEEN NUMBER OF ARC DISCHARGE AND SPUTTERING CONDITION (INPUT ELECTRIC POWER)

|  | 2.9w/cm2 | 4.3w/cm2 | 5.7w/cm2 |
|---|---|---|---|
| 0.5Pa | (NUMBER OF TIME OF ARC) 7 | 6 | 5 |
| 1.0Pa | 3 | 4 | 3 |
| 1.5Pa | 1 | 1 | 0 |
| 2.0Pa | 2 | 1 | 2 |

(PRESSURE)

NOTE : OTHER CONDITIONS WEAR CONSTANT

TABLE 2

|  | TOTAL GAS FLOW RATE m/s | | |
|---|---|---|---|
|  | 0.22 | 0.67 | 1.33 |
| NUMBER OF ARC DISCHARGE | 3 | 1 | 0 |

NOTE : OTHER CONDITIONS WEAR CONSTANT

TABLE 3

|  | GAS RATIO N2/(Ar+N2) | | | |
|---|---|---|---|---|
|  | 38% | 43% | 55% | 72% |
| NUMBER OF ARC DISCHARGE | 2 | 0 | 1 | 1 |

NOTE : OTHER CONDITIONS WEAR CONSTANT

TABLE 4

| SUBSTRATE TEMPERATURE(°C) | 300 | 400 | 500 | 600 |
|---|---|---|---|---|
| EVALUATION | ✕～△ | ○ | ◎ | ◎ |

NOTE : EVALUATION WAS MADE BY EYE OBSERVATION OF A SURFACE STATE

IN WHICH GAN WAS GROWN BY 2μm BY MOCVD AFTER SPUTTERING

METHOD FOR PRODUCING GROUP-III NITRIDE COMPOUND SEMICONDUCTOR DEVICE

TECHNICAL FIELD

The present invention relates to a method for producing a Group III nitride compound semiconductor device.

BACKGROUND ART

A Group III nitride compound semiconductor device such as a blue light-emitting device or the like was obtained in such a manner that a buffer layer of $Al_xGa_{1-x}N$ ($0 \leq X \leq 1$) was grown on a sapphire substrate by a metal organic chemical vapor deposition method (referred to as "MOCVD method" in this description) and a Group III nitride compound semiconductor layer was further grown thereon by an MOCVD method likewise.

In the MOCVD method, an ammonia gas and gases of Group III alkyl compounds such as trimethyl aluminum (TMA), trimethyl gallium (TMG) and trimethyl indium (TMI) were supplied onto a substrate heated at a suitable temperature, so that the gases were thermally decomposed to thereby form a film of desired crystal on the substrate. On this occasion, metalorganic materials such as TMA, etc. constituting raw material gases for the buffer layer were so expensive that they became a factor of causing increase of the cost of the Group III nitride compound semiconductor device.

If the buffer layer of $Al_xGa_{1-x}N$ ($0 \leq X \leq 1$) is formed by another method than the MOCVD method, use of metalorganic materials such as TMA, TMG, etc. can be avoided. For example, Examined Japanese Patent Publication No. Hei. 5-86646 has made a proposal including the steps of: forming a buffer layer by a high-frequency sputtering method; heating a substrate (at a temperature of 800 to 1000° C.) in an ammonia gas-containing atmosphere (of ammonia and nitrogen according to an embodiment); and supplying Group III metalorganic materials onto the heated substrate to thermally decompose the Group III metalorganic materials to perform vapor growth of a film of nitride thereof to thereby grow $Al_xGa_{1-x}N$ ($0 \leq X \leq 1$) of the same composition as the buffer layer on the buffer layer. Raw materials for forming the buffer layer of $Al_xGa_{1-x}N$ ($0 \leq X \leq 1$) by the high-frequency sputtering method are high-purity metallic aluminum and high-purity metallic gallium. While these raw materials are used as a target, a mixture gas of argon and nitrogen is used as a sputtering gas. In this case, all the raw materials are inexpensive. Hence, the cost of the device can be reduced compared with the case where the buffer layer is formed by the MOCVD method using expensive organometals as raw materials.

The present inventors had tried the method disclosed in Examined Japanese Patent Publication No. Hei. 5-86646. As a result, the crystallinity of the Group III nitride compound semiconductor layer formed by the MOCVD method on the buffer layer of $Al_xGa_{1-x}N$ ($0 \leq X \leq 1$) formed by the ratio-frequency sputtering method could not satisfy the present inventors' requirement. That is, the crystallinity of the Group III nitride compound semiconductor layer obtained by the tried method is inferior to the crystallinity of the Group III nitride compound semiconductor layer formed by the MOCVD method on the buffer layer of $Al_xGa_{1-x}N$ ($0 \leq X \leq 1$) formed by the MOCVD method.

DISCLOSURE OF THE INVENTION

The present inventors have made investigation again and again to improve the crystallinity of the Group III nitride compound semiconductor layer obtained by the sputtering method. As a result, the present inventors obtain a finding to define preferred conditions for forming the Group III nitride compound semiconductor layer on the substrate by the sputtering method. That is, a method for producing a Group III nitride compound semiconductor device according to the present invention is provided as follows.

A method of producing a Group III nitride compound semiconductor device, wherein an initial voltage of a sputtering apparatus is selected to be not higher than 110% of a sputtering voltage when a first Group III nitride compound semiconductor layer is formed on a substrate by a sputtering method.

In the method of producing a Group III nitride compound semiconductor device according to the present invention, the initial voltage is restrained to be not higher than 110% of the sputtering voltage when the first Group III nitride compound semiconductor layer is grown on the substrate by the sputtering method. Hence, it is conceived that the growth of the first Group III nitride compound semiconductor is stabilized at the initial stage of growth so that the first Group III nitride compound semiconductor layer gets into a state approaching to single crystal at the initial stage of growth. As a result, the first Group III nitride compound semiconductor layer becomes excellent in crystallinity as a whole.

On the other hand, if the applied voltage at the initial stage is high, the growth rate at the initial stage becomes unstable. As a result, it is conceived that the first Group III nitride compound semiconductor layer grown on the substrate different in material therefrom is easily made polycrystalline or amorphous rather than monocrystalline. This has influence on the whole of the first Group III nitride compound semiconductor layer to reduce the crystallinity of the first Group III nitride compound semiconductor layer.

BEST MODE FOR CARRYING OUT THE INVENTION

Respective members of the invention will be described below in detail.

<Substrate>

The material of the substrate is not particularly limited if a first Group III nitride compound layer can be grown thereon. Examples of the material of the substrate include sapphire, silicon, silicon carbide, zinc oxide, gallium phosphide, gallium arsenide, magnesium oxide, manganese oxide, single crystal of Group III nitride compound semiconductor, etc.

Of them, a sapphire substrate is preferably used, and a sapphire with a plane is more preferably used.

<First Group III Nitride Compound Layer>

In this description, each of group III nitride compound semiconductors is represented by the general formula $Al_XGa_YIn_{1-X-Y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$ in the above). The group III elements may be partially replaced by boron (B), thallium (Tl), or the like. Further, the nitrogen (N) may be partially replaced by phosphorus (P), arsenic (As), antimony (Sb), bismuth (Bi), or the like. Si, Ge, Se, Te, C, or the like, can be used as n-type impurities. Mg, Zn, Be, Ca, Sr, Ba, or the like, can be used as p-type impurities.

In this invention, a GaN layer or an AlN layer is preferably used as the first Group III nitride compound semiconductor layer. An AlN layer is more preferably used.

The film thickness of the first Group III nitride compound semiconductor layer is not particularly limited but preferably selected to be in a range of from 5 to 300 nm, more preferably in a range of from 10 to 100 nm.

A general method including a reactive sputtering method can be used as the sputtering method. Particularly, a DC sputtering method is preferable. In addition, according to a DC magnetron sputtering method, the film quality can be controlled easily by parameters while damage of the substrate side due to plasma can be reduced. In accordance with the sputtering method, metallic aluminum, metallic gallium, metallic indium and a nitrogen or ammonia gas are used as source materials for forming the first Group III nitride compound layer. Alternatively, a Group III nitride compound itself may be used directly as a target. In any case, these raw materials are inexpensive compared with the case where metal organic materials are used.

It may be effective that a plasma treatment (including etching) is performed by using gas containing argon, nitrogen and oxygen before execution of sputtering.

The sputtering voltage is defined as a voltage which is applied between the substrate and the target in a sputtering system and which is stabilized after plasma is generated when a Group III nitride compound semiconductor is grown on the substrate. This voltage is the lowest voltage during growing the Group III nitride compound semiconductor. On the other hand, the initial voltage is defined as a voltage at the time of starting sputtering. For 3 to 10 seconds after the start, the initial voltage needs to be restrained to be not higher than 110% of the sputtering voltage (see FIG. 3).

Figure 1:
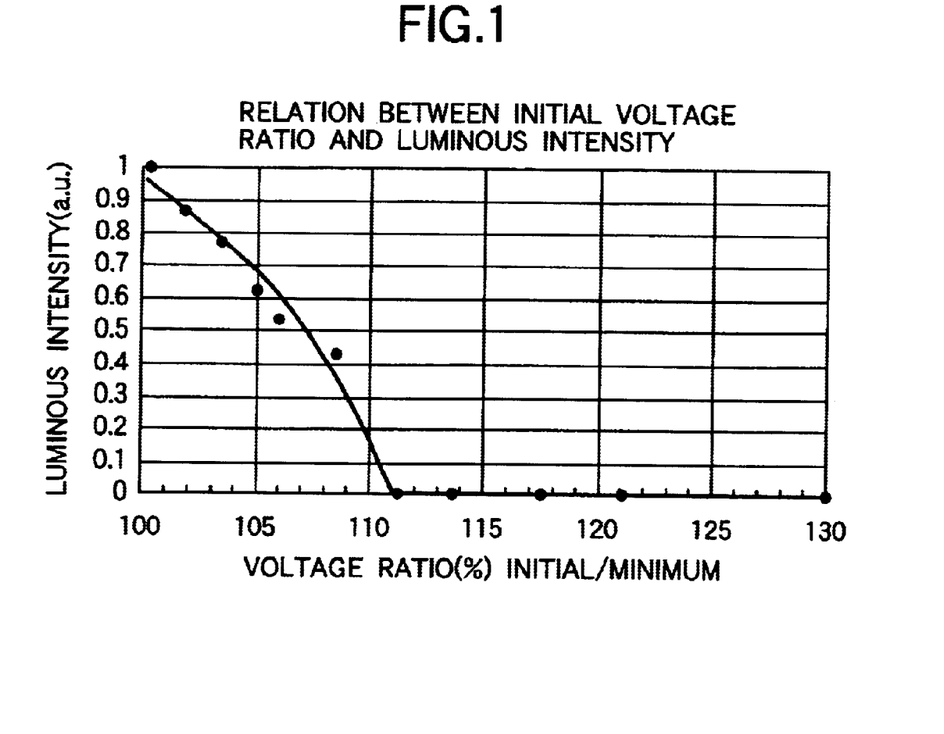
FIG. 1 is a graph showing the relation between initial voltage and luminous output.
Figure 2:
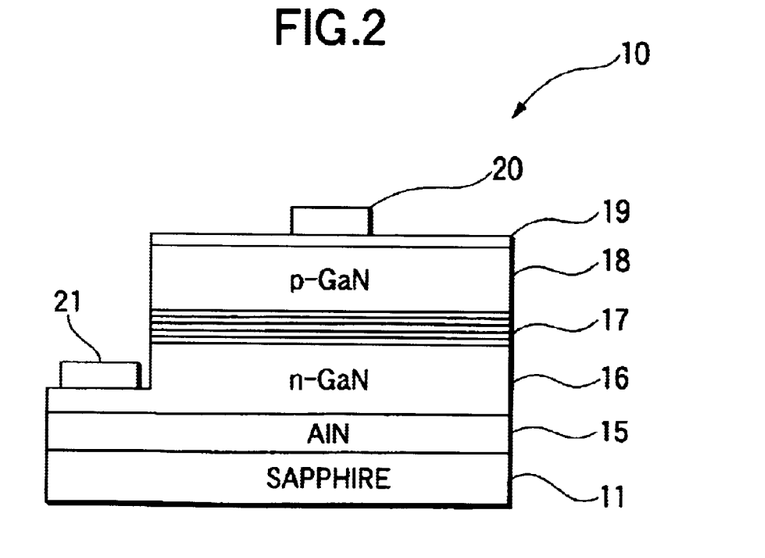
FIG. 2 shows a light-emitting diode according to an embodiment of the invention.

FIG. 1 shows the relationship between initial voltage of sputtering and luminous intensity of a light-emitting diode. The structure of the light-emitting diode 10 is as shown in FIG. 2. Compositions and film thicknesses of respective layers are as follows.

| Layer: | Composition: | Dopant | (Thickness) |
|---|---|---|---|
| Translucent electrode 19 | | | |
| p-type clad layer 18: | p-GaN: | Mg | (0.3 μm) |
| Light-emitting layer 17: | Superlattice structure | | |
| Quantum well layer: | $In_{0.15}Ga_{0.85}N$ | | (3.5 nm) |
| Barrier layer: | GaN | | (3.5 nm) |
| The number of repeated quantum well and barrier layers: 1 to 10 | | | |
| n-type clad layer 16: | n-GaN: | Si | (4 μm) |
| Sputtering growth layer 15: | AlN | | (30 nm) |
| Substrate 11: | Sapphire (surface a) | | (300 μm) |

The sputtering growth layer 15 as the first Group III nitride compound layer was formed by a DC sputtering apparatus while the initial voltage was changed. On this occasion, sputtering conditions were substrate temperature 450° C., Ar flow rate: 18 sccm, $N_2$ flow rate: 22 sccm, input electric power and time: changed for adjusting the initial voltage (e.g., 3 KW and 95 seconds), and pressure at sputtering: 0.5 Pa. The Group III nitride compound semiconductor layers constituted by the n-type clad layer 16 and the layers upper than the n-type clad layer 16 were formed in accordance with an ordinary method such as an MOCVD method. The luminous output expressed by the vertical axis in FIG. 1 was measured in such a manner that light obtained when a current of 20 mA applied to the light-emitting diode was detected by a photo detector. The luminous intensity is expressed by a ratio thereof to the obtained maximum output (at the voltage ratio of 100%) As obvious from FIG. 1, when the initial voltage is higher than 110% of the sputtering voltage (which is 100% in the horizontal axis in FIG. 1), the luminous intensity becomes zero so that the luminous intensity cannot be obtained sufficiently (light emission could not be observed by eyes).

Figure 20:
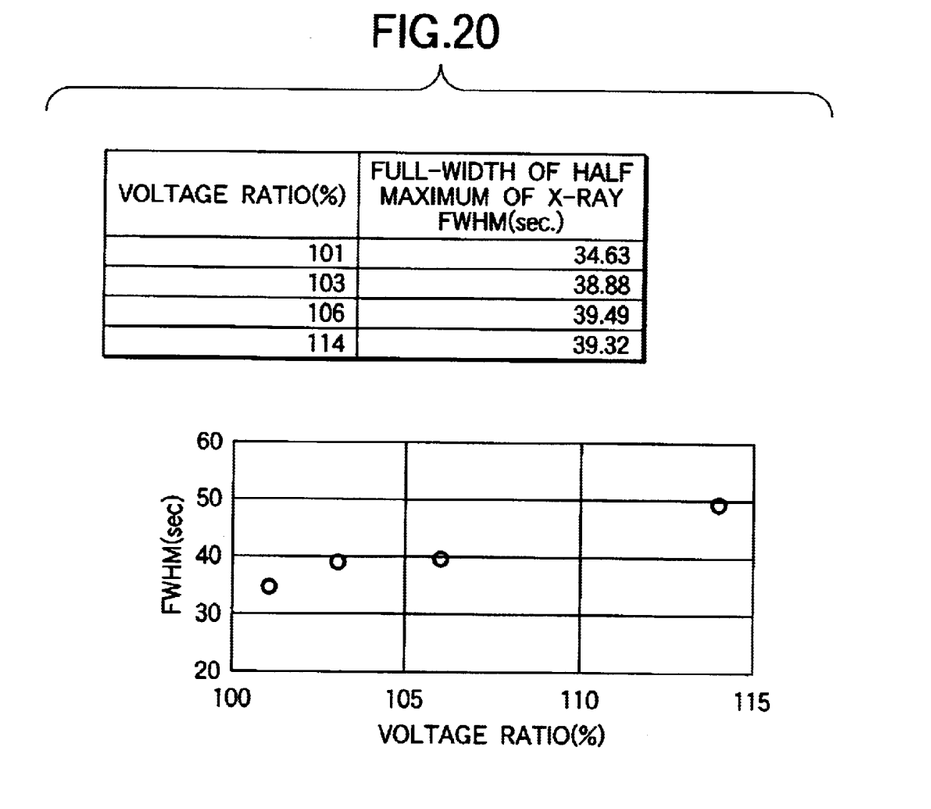
FIG. 20 is a table and a figure showing the value of full-width of half maximum in an X-ray rocking curve of a GaN layer.

FIG. 20 shows the relation between the initial voltage of sputtering and the value of full width of half maximum in an X-ray rocking curve of a GaN layer that is the n-type clad layer. In this example, an AlN layer as the sputtering layer is deposited by a film thickness of 60 nm on the sapphire substrate and a GaN layer is further grown by a film thickness of 4 μm. As is obvious from the figure, a layer excellent in crystallinity can be formed on the first Group III nitride compound semiconductor layer when the initial voltage of the sputtering apparatus is selected to be not higher than 110% of the sputtering voltage.

It is obvious from the above that the initial voltage of the sputtering system is preferably selected to be not higher than 110% of the sputtering voltage. When the initial voltage is selected at a low voltage in the aforementioned manner for several seconds after the start of sputtering, the growth of the Group III nitride compound semiconductor layer is stabilized. When a Group III nitride compound semiconductor layer is sputtered on a substrate different from the sapphire, the initial crystallinity of the layer is particularly important because the initial cryatallinity has great influence on crystal grown on the layer. Therefore, when the initial voltage is selected to be not higher than 110% of the sputtering voltage, the Group III nitride compound semiconductor material is crystallized as single crystal or approaches to single crystal very much. Hence, a layer further formed on the initially formed semiconductor layer by sputtering is also easily crystallized as single crystal. As a result, the first Group III nitride compound semiconductor layer becomes a layer excellent in crystallinity as a whole.

As described above, the applied voltage needs to be controlled to be low for several seconds after the start of sputtering but the applied voltage may be increased after that. In this manner, the sputtering layer 15 can be formed efficiently.

Although FIG. 1 shows a result obtained in the case where an AlN layer is used as the first Group III nitride compound semiconductor layer which is the sputtering growth layer by way of example, it is conceived that the same result can be obtained also in the case where another Group III nitride compound semiconductor material is used.

A method for restraining the initial voltage of sputtering will be described below.

Generally speaking, a high voltage is required just after the start of sputtering. This is because a high voltage is required for destroying an electrically insulating film such as an oxide film with which a surface of a target is covered.

From this point of view, the inside of the sputtering system is kept in a high vacuum state before the start of next sputtering after execution of previous sputtering, that is, after execution of sputtering for production of the previous product so that an electrically insulating film can be prevented from being formed on a surface of a target or can be thinned or roughened even in the case where the electrically insulating film is formed. Preferably, the high vacuum state is kept for a time not longer than 10 minutes. Hence, in order to enable current conduction between the substrate and the target, it is unnecessary to destroy the electrical insulation on the surface of the target or it is possible to destroy the electrical insulation by a very low voltage.

Figure 3:
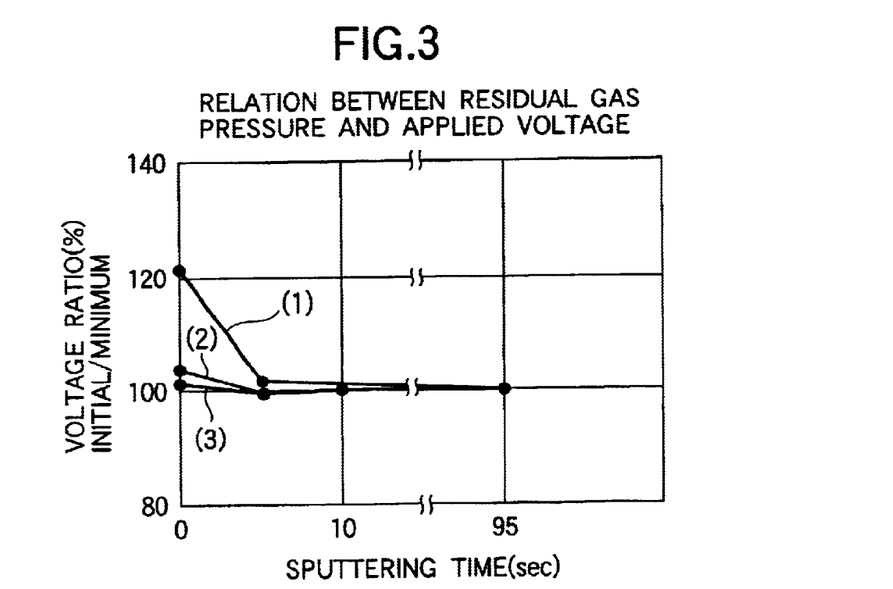
FIG. 3 is a graph showing the relation between residual gas pressure (pressure in a sputtering chamber) and applied voltage.

FIG. 3 shows the relationship between residual gas pressure in the sputtering system before the start of sputtering and applied voltage in the sputtering apparatus. The sputtering conditions are substrate temperature 450° C., Ar flow rate: 18 sccm, $N_2$ flow rate: 22 sccm, input electric power: 3 kW (95 sec.), chamber pressure at sputtering: 0.5 Pa. The applied voltage is stabilized after about 5 seconds passes since application. The stabilized voltage is called sputtering voltage.

Data (1) in FIG. 3 shows the case where the substrate was placed on a carbon tray under the condition that the pressure in the sputtering chamber before sputtering was maintained at $1.10 \times 10^{-4}$ Pa and for 600 seconds. In this case, the initial voltage of sputtering became about 120% of the sputtering voltage. When the second Group III nitride compound semiconductor layers were formed on the thus formed sputtering layer by an MOCVD method to thereby form a light-emitting diode shown in FIG. 2, the luminous intensity ratio (corresponding to the vertical axis in FIG. 1) was zero so that light emission could not be observed by eyes.

Data (2) in FIG. 3 are obtained under the same conditions as in the aforementioned data (1) except that the pressure in the sputtering system before sputtering was reduced to $8.10 \times 10^{-5}$ Pa. In data (2), the initial voltage of sputtering is about 104% of the sputtering voltage, which is a value satisfying the invention's requirement of being not higher than 110% of the sputtering voltage. In this case, the luminous intensity ratio (corresponding to the vertical axis in FIG. 1) was 0.85.

From the above results, the pressure in the sputtering tank before sputtering is preferably selected to be not higher than $1.0 \times 10^{-4}$ Pa.

It is conceived that this rule can be applied also to the case where the sputtering layer is made of another Group III nitride compound semiconductor than AlN.

Data (3) in FIG. 3 are obtained under the same conditions as in the aforementioned data (1) except that the pressure in the sputtering tank before sputtering was $6.40 \times 10^{-5}$ Pa, and further, the substrate tray was made of silicon single crystal. In data (3), the initial voltage of sputtering is about 102% of the sputtering voltage, which is a value satisfying the invention's requirement of being not higher than 110% of the sputtering voltage. In this case, the luminous intensity ratio (corresponding to the vertical axis in FIG. 1) was 1.00.

Since there is no large difference in the sputtering chamber pressure before sputtering in comparison between data (3) and data (2), it is conceived that the change of the tray material from carbon to silicon single crystal results in reduction in the initial voltage of sputtering and, accordingly, improvement in luminous intensity. Generally, carbon has a tendency to adsorb/emit gas molecules compared with silicon single crystal. It is therefore conceived that the difference between data (2) and data (3) depends on difference in gas which is emitted from the tray material in spite of the substantially same level of vacuum in the sputtering chamber so that the gas from the carbon tray reacts with a surface of the target (Al).

Figure 4:
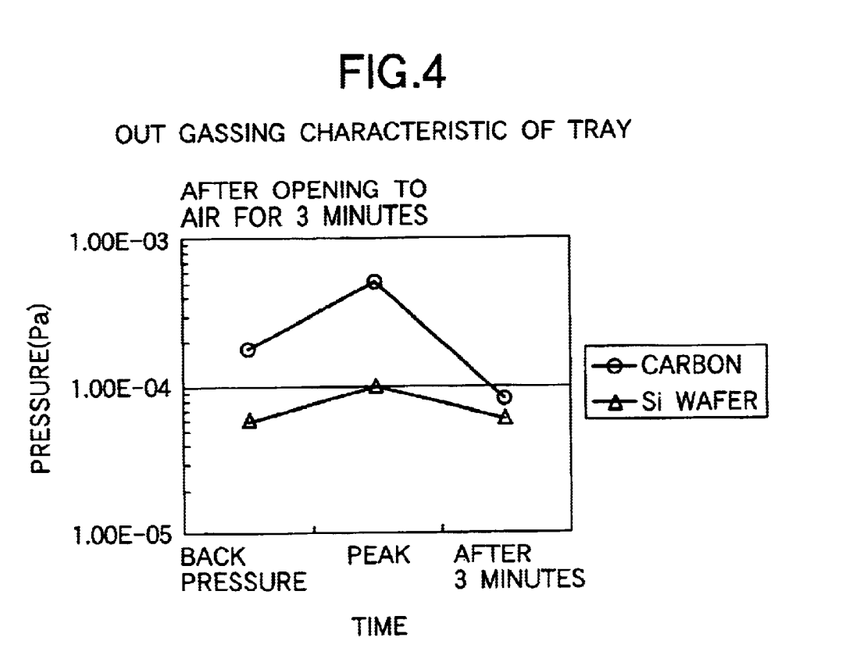
FIG. 4 is a graph showing outgassing characteristic of a tray.

FIG. 4 shows the change of the pressure in the sputtering chamber in the case where each of the carbon tray and the Si wafer tray was put in the sputtering apparatus after exposed to the air for 3 minutes. It is obvious from FIG. 4 that a larger amount of gas is emitted from the carbon tray.

It is preferable from the above description that the tray (substrate holder) is made of a material hard to adsorb/emit gas. Examples of the material include metal, silicon, TiN, quartz glass, etc. It will go well if at least one surface of the tray is made of such a material.

It is preferable from this point of view that at least the inside surface of the sputtering chamber is formed (coated) with such a material. Incidentally, refer to Applied Physics Vol.69, No.1, 2000.01, pp.22–28 as related literature.

FIGS. 5 to 17 show photographs obtained when RHEED is executed on various kinds of sample.

Figure 5:
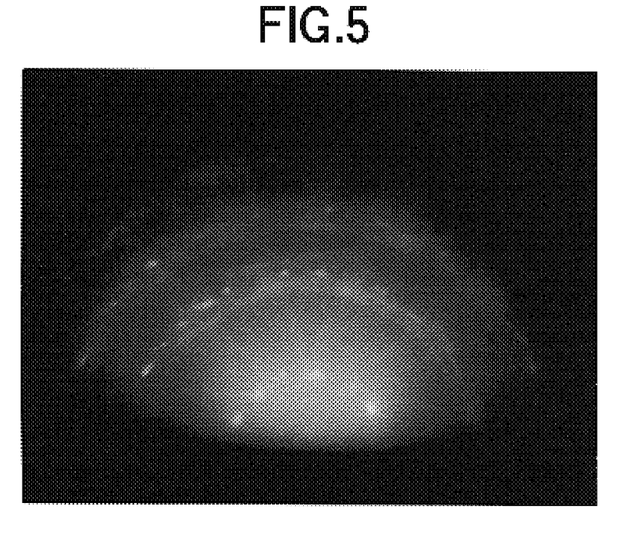
FIG. 5 is an RHEED photograph of a surface a of sapphire.
Figure 6:
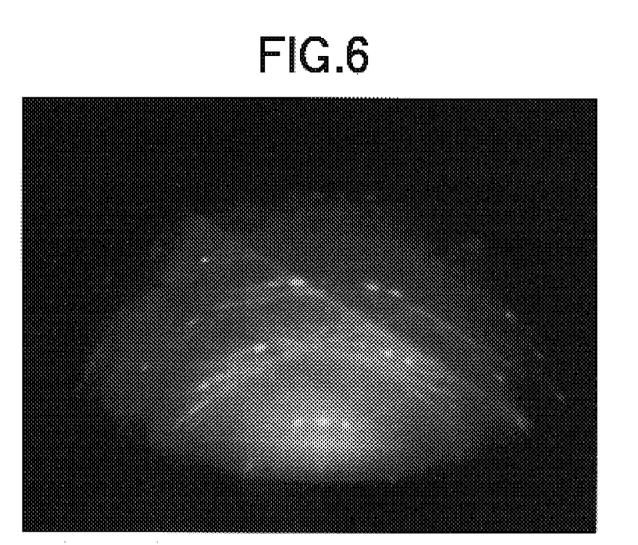
FIG. 6 is an RHEED photograph of a surface a of sapphire.

FIGS. 5 and 6 are RHEED photographs of a sapphire with a plane.

Figure 7:
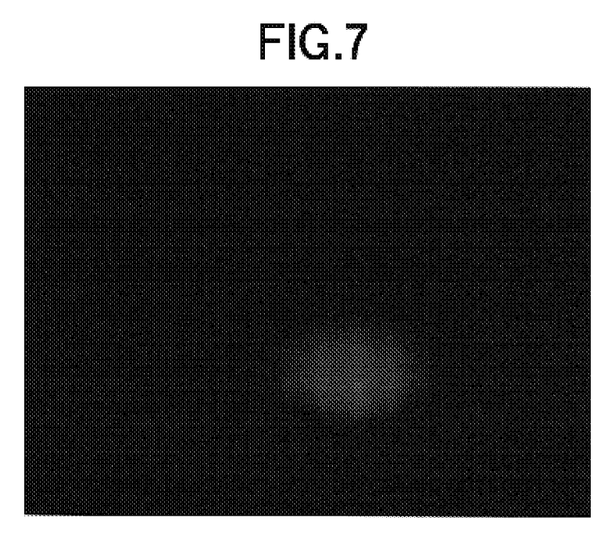
FIG. 7 is an RHEED photograph of AlN after sputtering is carried out for 5 seconds in the case (data (3)) where the initial voltage is 102% of the sputtering voltage.
Figure 8:
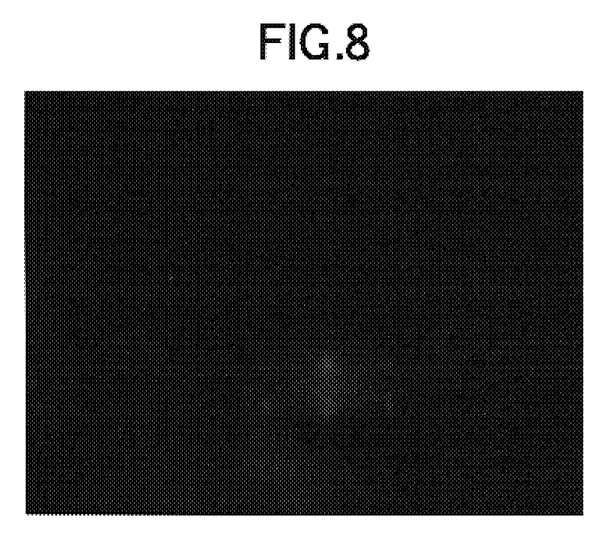
FIG. 8 is an RHEED photograph when the AlN of FIG. 7 is rotated by 30 degrees.
Figure 9:
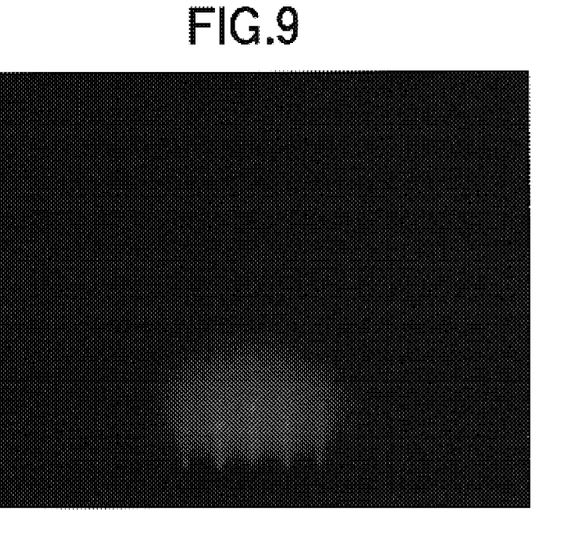
FIG. 9 is an RHEED photograph when the AlN is grown up to a film thickness of 30 nm by further continuing sputtering.
Figure 10:
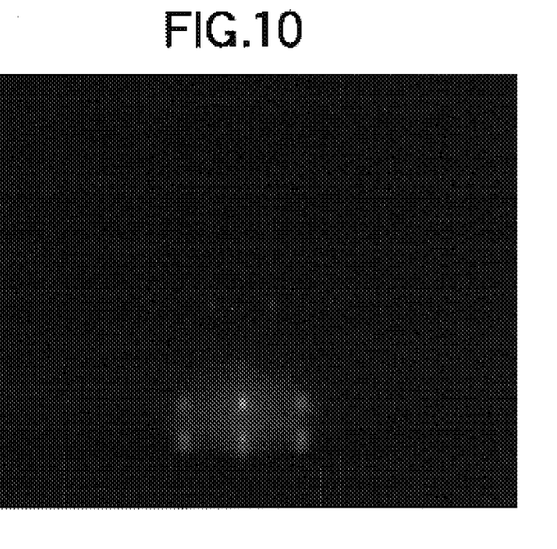
FIG. 10 is an RHEED photograph when the AlN of FIG. 9 is rotated by 30 degrees.
Figure 11:
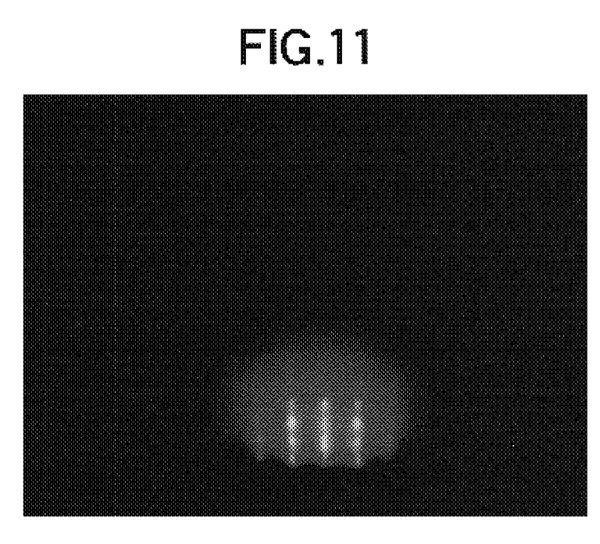
FIG. 11 is an RHEED photograph when the AlN is heated after grown up to the film thickness of 30 nm.
Figure 12:
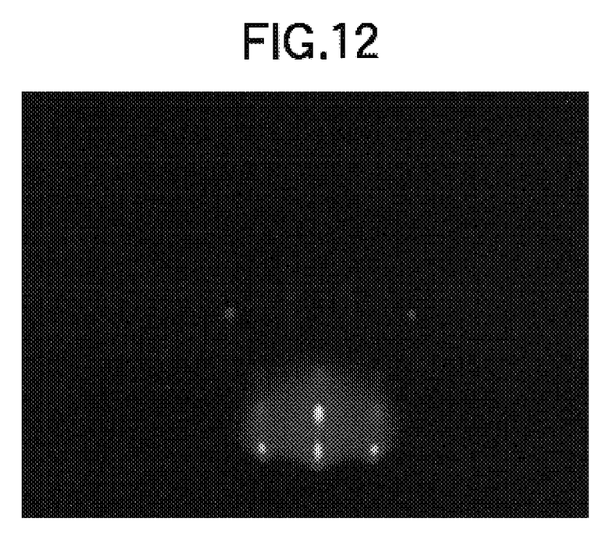
FIG. 12 is an RHEED photograph when the AlN of FIG. 11 is rotated by 30 degrees.

FIG. 7 is an RHEED photograph of AlN after sputtering is carried out for 5 seconds in the case (data (3)) where the initial voltage is 102% of the sputtering voltage under the sputtering conditions shown in FIG. 3 (substrate temperature 450° C., Arflowrate: 18 sccm, N2 flowrate: 22 sccm, input electric power: 3 kW (95 sec.), chamber pressure at sputtering: 0.5 Pa). FIG. 8 is an RHEED photograph when an electron beam incident angle is rotated by 30 degrees from case of FIG. 7. FIG. 9 is an RHEED photograph when the AlN is grown up to a film thickness of 30 nm by continuing sputtering. FIG. 10 is an RHEED photograph when an electron beam incident angle is rotated by 30 degrees from case of FIG. 9. FIG. 11 is an RHEED photograph when the AlN is heated after grown up to the film thickness of 30 nm. FIG. 12 is an RHEED photograph when an electron beam incident angle is rotated by 30 degrees. It can be confirmed from the above that good crystallinity is obtained at each stage in the case (data (3)) where the initial voltage is 102% of the sputtering voltage.

Figure 13:
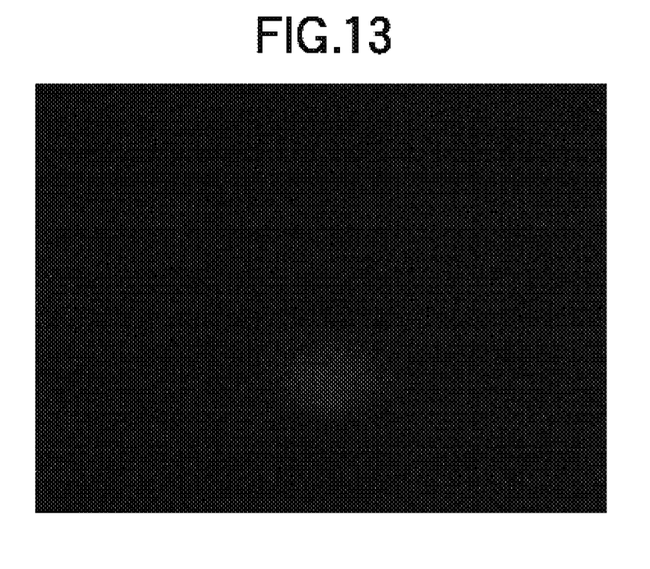
FIG. 13 is an RHEED photograph after sputtering is carried out for 5 seconds in the case (data (1)) where the initial voltage is 120% of the sputtering voltage.
Figure 14:
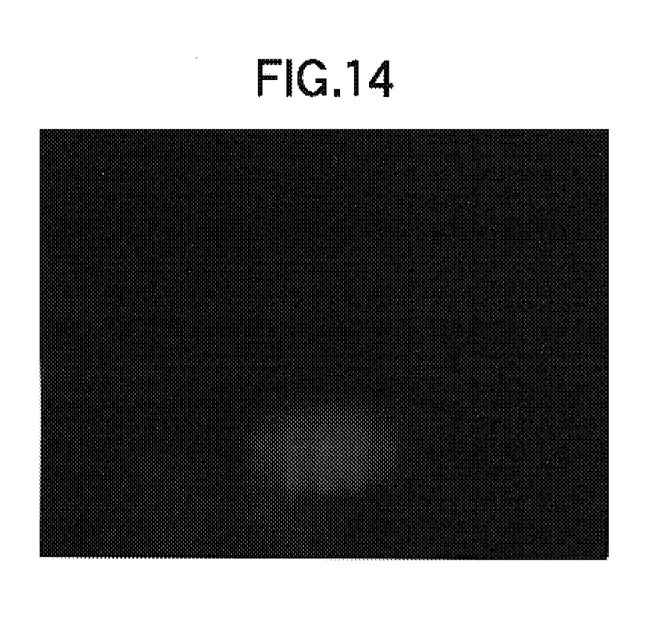
FIG. 14 is an RHEED photograph when AlN is grown up to a film thickness of 30 nm by further continuing sputtering.
Figure 15:
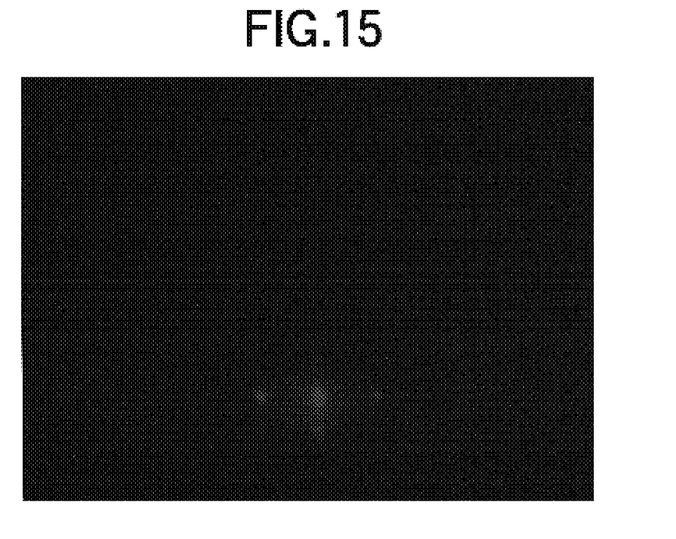
FIG. 15 is an RHEED photograph when the AlN of FIG. 14 is rotated by 30 degrees.
Figure 16:
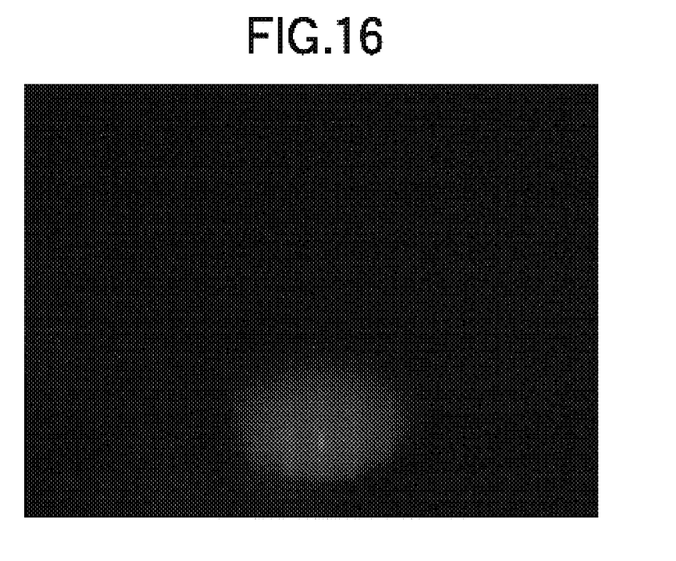
FIG. 16 is an RHEED photograph when the AlN is heated after grown up to the film thickness of 30 nm.
Figure 17:
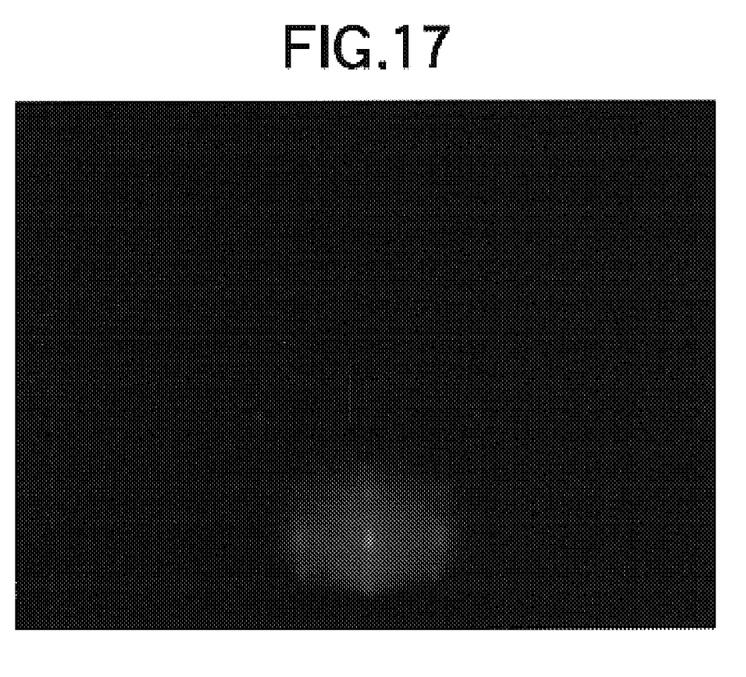
FIG. 17 is an RHEED photograph when the AlN of FIG. 16 is rotated by 30 degrees.

FIG. 13 is an RHEED photograph after sputtering is carried out for 5seconds in the case (data (1)) where the initial voltage is 120% of the sputtering voltage under the same sputtering conditions. FIG. 14 is an RHEED photograph when AlN is grown up to a film thickness of 30 nm by continuing sputtering. FIG. 15 is an RHEED photograph when an electron beam incident angle is rotated by 30 degrees from the case of FIG. 14. FIG. 16 is an RHEED photograph after heating of the sample with the film thickness of 30 nm. FIG. 17 is an RHEED photograph when an electron beam incident angle is rotated by 30 degrees from the case of FIG. 17. It is obvious from the above that the case (data (1)) where the initial voltage is 120% of the sputtering voltage is inferior in crystallinity at each stage to the case (data (3)) where the initial voltage is 102% of the sputtering voltage.

Figure 18:
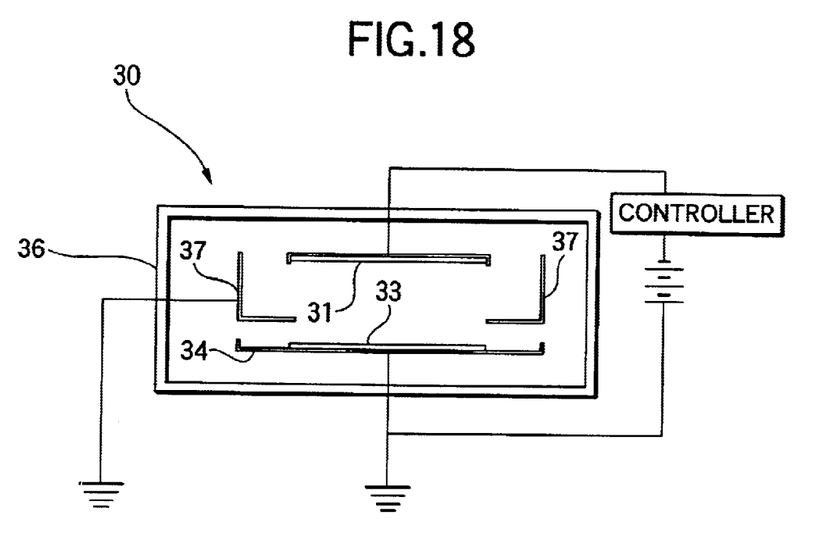
FIG. 18 is a schematic diagram showing the schematic configuration of a DC sputtering apparatus.

Generally, as shown in FIG. 18, the sputtering apparatus 30 has a structure in which electric power applied between the substrate 33 and the target 31 is controlled. Hence, if the current flowing between the substrate 33 and the target 31 is increased, the voltage between the two can be consequently kept low. From this point of view, the following examination is intended to set the initial voltage of sputtering in the desired range.

First, as measures to increase the current flowing between the substrate 33 and the target 31, an anti-adhesion plate 37 in the sputtering chamber 36 is electrically grounded. Hence, electric flux lines emitted from the target 31 (biased negatively) go not only toward the substrate 33 (generally, the ground) but also toward the anti-adhesion plate 37. As a result, the density of electric flux lines entering the substrate 33, that is, the electric field in this portion is reduced, so that the electric potential with respect to the target is reduced. In other words, when the anti-adhesion plate 37 is electrically grounded, the number of electric flux lines emitted from the target 31 increases to make the current high to thereby reduce the electric potential between the target 31 and the substrate 33, compared with the case where only the substrate 33 is electrically grounded.

It is preferable from the same point of view that the area of the substrate 33 is made smaller. For example, the area of the substrate 33 is selected to be not larger than 100% as large as the area of the target 31.

Further from the same point of view, the surface of the tray 34 (substrate holder) and/or the surface of the sputtering chamber 36 are/is formed (coated) with an electrically conductive material. Examples of the electrically conductive material may include electrically conductive metal and TiN which are hard to adsorb/emit gas, etc.

According to the inventors' examination, the preferred sputtering conditions for forming the first Group III nitride compound semiconductor layer by a DC sputtering method are as follows. When the conditions are satisfied, abnormal electric discharge can be prevented from occurring in execution of sputtering.

Figure 19:
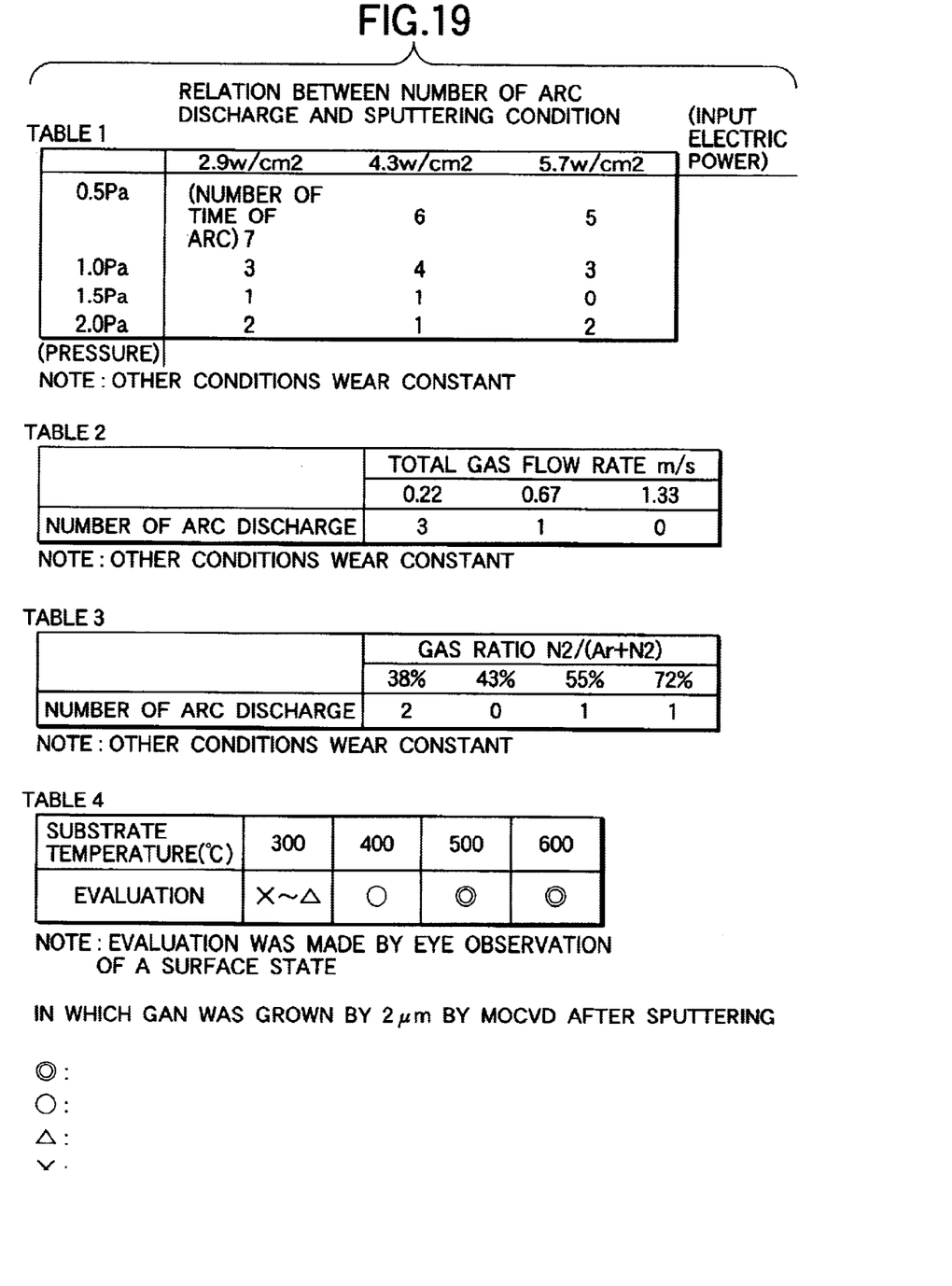
FIG. 19 is tables showing the relation between number of an arc discharge and each sputtering condition.

Preferred DC Sputtering Conditions:
Gas Flow Rate: 0.67 m/s or higher
Gas Pressure: 1.5 Pa or higher
Input Electric Power: 5.7 w/cm$^2$ or lower
Gas Ratio ($N_2/(Ar+N_2)$)≧43%
Temperature: 400° C. or higher FIG. 19 shows tables on the relation between the number of arc discharge generated by abnormal electric discharge and each sputtering condition.

<Second Group III Nitride Compound Semiconductor Layer>

The second Group III nitride compound semiconductor layer has a device function. Examples of the device include: optical devices, such as a light-emitting diode, a photodetector, a laser diode, a solar cell, etc.; bipolar devices such as a rectifier, a thyristor, a transistor, etc.; unipolar devices such as an FET, etc.; and electronic devices such as a microwave device, etc. The invention may be also applied to laminates produced as intermediates of these devices.

Incidentally, a homo structure, a hetero structure or a double hetero structure provided with an MIS junction, a PIN junction or a p-n junction can be used as the structure of the light-emitting device. A quantum well structure (single quantum well structure or multiple quantum well structure) may be used as the light-emitting layer.

The same material as used for forming the aforementioned first Group III nitride compound layer can be used as the material for forming the second Group III nitride compound semiconductor layer. The second Group III nitride compound semiconductor may contain any optional dopant. Si, Ge, Se, Te, C, or the like, can be used as n-type impurities. Mg, Zn, Be, Ca, Sr, Ba, or the like, can be used as p-type impurities.

In order to obtain more excellent crystallinity, a layer of GaN or a layer of $Al_XGa_{1-X}N$ ($0 \leq X \leq 1$) is preferably used as the second Group III nitride compound semiconductor layer coming in contact with the first Group III nitride compound layer.

A method for forming the second Group III nitride compound semiconductor layer is not particularly limited. For example, besides a metal organic chemical vapor deposition method (MOCVD method), the second Group III nitride compound semiconductor layer can be also formed by a known method such as a molecular beam epitaxy method (MBE method), a halide vapor phase epitaxy method (HVPE method), a sputtering method, anion-plating method, an electron showering method, or the like.

The first Group III nitride compound layer is heated with the increase of the substrate temperature when the second Group III nitride compound semiconductor layer is formed by execution of an MOCVD method.

It is preferable that the carrier gas used in the MOCVD method is either of hydrogen and nitrogen or a mixture of hydrogen and nitrogen.

In other words, it is preferable that the first Group III nitride compound layer is heated under an atmosphere of a mixture gas containing either of hydrogen gas and nitrogen gas, and nitrogen material gas (ammonia, hydrazine or the like). On this occasion, the temperature for the heat treatment is preferably selected to be in a range of from 1000 to 1250° C.

Incidentally, after the first Group III nitride compound semiconductor layer is formed, the second Group III nitride compound semiconductor layer is formed thereon while the first Group III nitride compound semiconductor layer is kept without any treatment.

Generally, in execution of MOCVD, cleaning (such as ultrasonic cleaning, acetone cleaning, acid cleaning, etc.) of an undercoat layer (the first Group III nitride compound semiconductor layer in this case) is often performed as a pre-treatment. According to the inventors' examination, however, many of the light-emitting devices obtained by execution of such cleaning emit did not uniformly. On the other hand, when such cleaning was omitted and the second Group III nitride compound semiconductor layer was grown on the first Group III nitride compound semiconductor layer while the first Group III nitride compound semiconductor layer was kept in an as-grown state, uniform light emission could be obtained from the light-emitting device obtained in this manner, that is, unevenness of light emission little occurred.

Embodiment

An embodiment of the invention will be described below.

This embodiment shows a light-emitting diode 10. FIG. 2 shows the schematic diagram of the light-emitting diode 10.

Specifications of respective layers are as described above.

The n-type clad layer 16 may be of a double-layered structure having an n− layer with low electron density on the light-emitting layer 17 side and an n+ layer with high electron density on the undercoat layer 15 side.

The light-emitting layer 17 is not limited to the superlattice structure. A single hetero structure, a double hetero structure, a homo junction structure, or the like, may be used as the structure of the light-emitting device.

A group III nitride compound semiconductor layer doped with an acceptor such as magnesium or the like and having a wide band gap may be interposed between the light-emitting layer 17 and the p-type clad layer 18. This is provided for preventing electrons injected into the light-emitting layer 17 from dispersing into the p-type clad layer 18. Alternatively, the p-type clad layer 18 itself may be made of p-AlGaN:Mg.

The p-type clad layer 18 may be of a double-layered structure having a p− layer with low hole density on the light-emitting layer 17 side and a p+ layer with high hole density on the electrode side.

The light-emitting diode configured as described above is produced as follows.

First, a sapphire substrate (tray: made of Si) is placed in a chamber of a DC sputtering apparatus. The inside of the sputtering layer is evacuated to $6.40 \times 1^{-5}$ Pa so that sputtering is performed newly within 10 minutes after the completion of previous sputtering, that is, after the completion of sputtering for production of the previous product. In this manner, the sputtering growth layer 15 is formed under the following conditions:

Substrate: sapphire with a plane

Substrate Temperature: 450° C.

Film Thickness of AlN Layer: 30 nm

Sputtering Gas: Ar (18 sccm)/$N_2$ (22 sccm)

Tank Pressure: 0.5 Pa

DC Power: 3 kW (electrode area of about 700 $cm^2$)

Then, the substrate is transferred to an MOCVD apparatus. The second Group III nitride compound semiconductor layers constituted by the n-type clad layer 16 and the layers upper than the n-type clad layer 16 are formed by a general method using hydrogen gas as a carrier gas without any cleaning step. Incidentally, the substrate temperature at the time of formation of the n-type clad layer 16 is 1130° C.

Then, a mask is formed and the p-type clad layer 18, the light-emitting layer 17 and the n-type clad layer 16 are partially removed by reactive ion etching to thereby reveal the n-type clad layer 16 on which an n electrode pad 21 is formed.

A photo resist is applied on the semiconductor surface evenly and then removed from the electrode-forming portion on the p-type clad layer 18 by photolithography to thereby reveal the p-type clad layer 18 from this portion. An Au—Co transparent electrode layer 19 is formed on the exposed p-type clad layer 18 by an evaporation apparatus.

Then, a p electrode pad 20 and an n electrode pad 21 are deposited similarly.

INDUSTRIAL APPLICABILITY

Although a light-emitting device has been described as an example in this description, it is a matter of course that the invention may be applied to various kinds of semiconductor devices and also applied to laminates which are intermediates of these semiconductor devices.

The invention is not limited to the description on the mode for carrying out the invention and the embodiment at all. Various modifications which can be easily conceived by those skilled in the art may be contained in the invention without departing from the description of Claims.

The following paragraphs are disclosed.

21. A method of producing a Group III nitride compound semiconductor layer, characterized in that an initial voltage of a sputtering apparatus is selected to be not higher than 110% of a sputtering voltage when a first Group III nitride compound semiconductor layer is formed on a substrate by a sputtering method.

22. A method of producing a Group III nitride compound semiconductor layer according to the paragraph 21, characterized in that the substrate is made of sapphire.

23. A method of producing a Group III nitride compound semiconductor layer according to the paragraph 22, characterized in that the first Group III nitride compound semiconductor layer is formed on the sapphire with a plane.

24. A method of producing a Group III nitride compound semiconductor layer according to any one of the paragraphs 21 through 23, characterized in that the first Group III nitride compound semiconductor layer is made of $Al_xGa_{1-x}N$ ($0 \leq x \leq 1$)

25. A method of producing a Group III nitride compound semiconductor layer according to any one of the paragraphs 21 through 23, characterized in that the first Group III nitride compound semiconductor layer is made of AlN.

26. A method of producing a Group III nitride compound semiconductor layer according to any one of the paragraphs 21 through 25, characterized in that the sputtering method is a DC sputtering method.

27. A method of producing a Group III nitride compound semiconductor layer according to any one of the paragraphs 21 through 26, characterized-in that chamber pressure in the sputtering apparatus before the start of sputtering is selected to be not higher than $1 \times 10^{-4}$ Pa.

28. A method of producing a Group III nitride compound semiconductor layer according to any one of the paragraphs 21 through 27, characterized in that a substrate holder in the sputtering apparatus is made of metal, quartz glass, or Si.

29. A method of producing a Group III nitride compound semiconductor layer according to any one of the paragraphs 21 through 27, characterized in that a substrate holder and/or the inside of a sputtering chamber in the sputtering apparatus are/is made of an electrically conductive material.

30. A method of producing a Group III nitride compound semiconductor layer according to any one of the paragraphs 21 through 29, characterized in that an anti-adhesion plate in the sputtering chamber is electrically grounded.

31. A method of producing a Group III nitride compound semiconductor layer according to any one of the paragraphs 21 through 30, characterized in that the area of the substrate is selected to be not larger than 100% as large as the area of a target.

32. A method of producing a Group III nitride compound semiconductor layer according to any one of the paragraphs 21 through 31, characterized in that while the first Group III nitride compound semiconductor layer formed by sputtering is kept in no-treatment, a second Group III nitride compound semiconductor layer is formed thereon by an MOCVD method.

33. A method of producing a Group III nitride compound semiconductor layer according to the paragraph 29, characterized in that the electrically conductive material contains electrically conductive metal or TiN.

34. A method of producing a Group III nitride compound semiconductor layer according to the paragraph 32, characterized in that the no-treatment of the first Group III nitride compound semiconductor layer does not include any cleaning step.

35. A method of producing a Group III nitride compound semiconductor layer according to the paragraph 21, characterized in that the sputtering voltage, is the lowest voltage for growing the first Group III nitride compound semiconductor layer when input electric power is kept constant.

41. A Group III nitride compound semiconductor device having a substrate, and a first Group III nitride compound semiconductor layer formed on the substrate, characterized in that the first Group III nitride compound semiconductor layer is formed by sputtering under the condition that an initial voltage of a sputtering apparatus is selected to be not higher than 110% of a sputtering voltage.

42. A Group III nitride compound semiconductor device according to the paragraph 41, characterized in that the substrate is made of sapphire.

43. A Group III nitride compound semiconductor device according to the paragraph 42, characterized in that the first Group III nitride compound semiconductor layer is formed on the sapphire with a plane.

44. A Group III nitride compound semiconductor device according to the paragraph 43, characterized in that the first Group III nitride compound semiconductor layer is made of $Al_xGa_{1-x}N$ ($0 \leq x \leq 1$).

45. A Group III nitride compound semiconductor device according to any one of the paragraphs 41 through 43, characterized in that the first Group III nitride compound semiconductor layer is made of AlN.

46. A Group III nitride compound semiconductor device according to any one of the paragraphs 41 through 45, characterized in that the sputtering method is a DC sputtering method.

47. A Group III nitride compound semiconductor device according to any one of the paragraphs 41 through 46, characterized in that chamber pressure in the sputtering apparatus before the start of sputtering is selected to be not higher than $1 \times 10^{-4}$ Pa.

48. A Group III nitride compound semiconductor device according to any one of the paragraphs 41 through 47, characterized in that a substrate holder in the sputtering apparatus is made of metal, quartz glass, or Si.

49. A Group III nitride compound semiconductor device according to any one of the paragraphs 41 through 47, characterized in that a substrate holder and/or the inside of a sputtering chamber in the sputtering apparatus are/is made of an electrically conductive material.

50. A Group III nitride compound semiconductor device according to any one of the paragraphs 41 through 49, characterized in that an anti-adhesion plate in the sputtering tank is electrically grounded.

51. A Group III nitride compound semiconductor device according to any one of the paragraphs 41 through 50, characterized in that the area of the substrate is selected to be not larger than 100 as large as the area of a target.

52. A Group III nitride compound semiconductor device according to any one of the paragraphs 41 through 51, characterized in that while the first Group III nitride compound semiconductor layer formed by sputtering is kept in no-treatment, a second Group III nitride compound semiconductor layer is formed thereon by an MOCVD method.

53. A Group III nitride compound semiconductor device according to the paragraph 49, characterized in that the electrically conductive material contains electrically conductive metal or TiN.

54. A Group III nitride compound semiconductor device according to the paragraph 52, characterized in that the no-treatment of the first Group III nitride compound semiconductor layer does not include any cleaning step.

55. A Group III nitride compound semiconductor device according to the paragraph 41, characterized in that the sputtering voltage is the lowest voltage for growing the first Group III nitride compound semiconductor layer when input electric power is kept constant.

56. A Group III nitride compound semiconductor device according to any one of the paragraphs 41 through 52, characterized in that a light-emitting device structure or a photodetector structure is formed from a second Group III nitride compound semiconductor layer.

71. A method of producing a Group III nitride compound semiconductor device, characterized in that when a first Group III nitride compound semiconductor layer is formed on a substrate by a method not using metalorganic materials as raw materials (such as a sputtering method including a reactive sputtering method (particularly, a DC sputtering method or a DC magnetron sputtering method), an evaporation method, an ion-plating method, a laser ablation method, an ECR method, etc.), the growth rate of the first Group III nitride compound semiconductor layer just after start of the formation is selected to be not higher than the lowest growth rate (the lowest growth rate under the condition that the first Group III nitride compound semiconductor layer can be grown).

What is claimed is:

1. A method of producing a Group III nitride compound semiconductor device, comprising the step of forming a first Group III nitride compound semiconductor layer on a substrate by a sputtering method, wherein an initial voltage in said step is selected to be not higher than 110% of a sputtering voltage.

2. A method of producing a Group III nitride compound semiconductor device according to claim 1, wherein said substrate is made of sapphire.

3. A method of producing a Group III nitride compound semiconductor device according to claim 2, wherein said first Group III nitride compound semiconductor layer is formed on said sapphire with a plane.

4. A method of producing a Group III nitride compound semiconductor device according to claim 1, wherein said first Group III nitride compound semiconductor layer is made of $Al_xGa_{1-x}N$ ($0 \leq x \leq 1$).

5. A method of producing a Group III nitride compound semiconductor device according to claim 1, wherein said first Group III nitride compound semiconductor layer is made of AlN.

6. A method of producing a Group III nitride compound semiconductor device according to claim 1, wherein said sputtering method is a DC sputtering method.

7. A method of producing a Group III nitride compound semiconductor device according to claim 1, further comprising the step of selecting pressure in a sputtering apparatus for use in said sputtering method to be not higher than $1\times10^{-4}$ Pa before start of sputtering.

8. A method of producing a Group III nitride compound semiconductor device according to claim 1, wherein a substrate holder in said sputtering apparatus for use in said sputtering method is made metal, quartz glass, or Si.

9. A method of producing a Group III nitride compound semiconductor device according to claim 1, wherein at least one of a substrate holder and inside of a sputtering chamber in said sputtering apparatus for said sputtering method is made of an electrically conductive material.

10. A method of producing a Group III nitride compound semiconductor device according to claim 9, wherein said electrically conductive material contains at least one of electrically conductive metal and TiN.

11. A method of producing a Group III nitride compound semiconductor device according to claim 9, wherein an anti-adhesion plate in said sputtering chamber is electrically grounded.

12. A method of producing a Group III nitride compound semiconductor device according to claim 1, wherein the area of said substrate is selected to be not larger than 100% as large as an area of a target.

13. A method of producing a Group III nitride compound semiconductor device according to claim 1, further comprising steps of:

keeping said first Group III nitride compound semiconductor layer in a no-treatment state; and forming a second Group III nitride compound semiconductor layer on said first Group III nitride compound semiconductor layer by an MOCVD method.

14. A method of producing a Group III nitride compound semiconductor device according to claim 13, wherein the step of keeping in said no-treatment state does not include any cleaning up-step.

15. A method of producing a Group III nitride compound semiconductor device according to claim 1, wherein said sputtering voltage is a lowest voltage for growing said first Group III nitride compound semiconductor layer when input electric power is kept constant.

16. A method of producing a Group III nitride compound semiconductor device according to claim 1, further comprising the step of forming a light-emitting device structure or a photodetector structure from a second Group III nitride compound semiconductor layer.

* * * * *